United States Patent [19]

Finger

[11] Patent Number: 4,712,195

[45] Date of Patent: Dec. 8, 1987

[54] SOLID-STATE CUMULATIVE OPERATIONS MEASUREMENT SYSTEM

[75] Inventor: Eugene P. Finger, Brewster, N.Y.

[73] Assignee: Curtis Instruments, Inc., Mt. Kisco, N.Y.

[21] Appl. No.: 861,339

[22] Filed: May 9, 1986

[51] Int. Cl.[4] .............................................. G11C 13/00
[52] U.S. Cl. .................................... 365/226; 365/149; 365/201; 365/228; 365/229; 365/233
[58] Field of Search ............... 365/201, 189, 230, 233, 365/149, 228, 229, 226

[56] References Cited

U.S. PATENT DOCUMENTS

| | | | |
|---|---|---|---|
| 4,285,050 | 8/1981 | Muller | 364/900 |
| 4,327,410 | 4/1982 | Patel et al. | 364/200 |
| 4,523,295 | 6/1985 | Zato | 364/900 |
| 4,564,922 | 1/1986 | Muller | 364/900 |

Primary Examiner—Terrell W. Fears

[57] ABSTRACT

The system accurately measures a summation of the operations when an operating voltage is present. The system includes a capacitor charged by a supply voltage and a volatile memory register connected to receive the operating voltage signals to be measured and operable to store those signals as a measure of operations. A nonvolatile memory register is provided having stages corresponding to the stages of the volatile memory register. A store sequencing means is connected to be powered by the energy stored in the capacitor when the supply voltage is removed to transfer the count stored in the volatile memory register into the nonvolatile memory register. A means is provided for detecting when the supply voltage is applied, with a recall sequencing means operable in response thereto to transfer the count stored in the nonvolatile memory register into the volatile memory register.

26 Claims, 6 Drawing Figures

SOLID-STATE CUMULATIVE OPERATIONS MEASUREMENT SYSTEM

This invention relates to improved cumulative operations measurment systems for providing a measurement and an indication of the total operations of a machine or apparatus for which an electrical voltage is available to indicate when the machine or apparatus is in operation. The invention is particularly useful for measuring the total operations of an electrical device or apparatus by detection of the application of operating voltage to the device or apparatus. Operations may be measured in terms of total operating time or in terms of a count of the number of times operation is initiated, or both.

BACKGROUND OF THE INVENTION

For many devices, particularly electrically energized devices such as electronic systems for communication, or data handling, or navigation control, for instance, it is very desirable to have some means of determining the cumulative startups. This is especially desirable when high reliability is required. The cumulative operations measurement provides a basis for determining when the device or apparatus should be given routine maintenance, or overhaul, or when a complete replacement should be made in order to assure reliability. Such reliability problems are especially important, for instance, in aircraft.

Prior cumulative operations measurement systems which measure operating time (referred to as "elapsed time indicators") have frequently employed electromechanical counter using synchronous motors or pulse circuits which actuate mechanical number registers which are similar to the mechanical registers in automobile odometers. These prior structures have a number of serious limitations and disadvantages. For instance, the accuracy of such devices is seriously limited by various factors. One of the most important factors is slow response to the initiation of the operating voltage resulting in a loss of up to five seconds for each startup of the apparatus being timed. These prior devices are also rather bulky in size. In order to keep the bulk down, the resolution is generally limited to about five decimal digits. This further reduces the precision with which the cumulative operating time is stored. Such electromechanical cumulative operating time indicators are also relatively costly, and each one adds a considerable weight. These factors are important when it is appreciated that a large number of such indicators may be required in a vehicle such as a aircraft where weight saving is vital.

Another problem with the electromechanical elapsed time indicators is that generally the only means of recording the cumulative operating time for the purpose of comparing prior readings, and for record-keeping purposes is to have the human operator take a visual reading of the elapsed time indicator and record that reading manually. This may typically involve removing a cover of the apparatus in which the elapsed time indicator is installed, and it is generally a laborious and time consuming activity. It would be much more convenient to have an elapsed time indicator which could be remotely read, and especially one which could be remotely read by a signal processor which could provide a permanent record automatically.

Still another problem with the electromechanical elapsed time indicators is that because of the different voltages and frequencies encountered in the machines for which cumulative operating time is to be recorded, different models of the time indicators must be provided which are adapted for operating at different voltages and frequencies. Furthermore, becuse of the limited resolution, different models must be provided an selected depending on the total anticipated operating time which is to be recorded.

Some of the above-mentioned disadvantages can be avoided by employing a coulometric elapsed time indicator in which a dc current causes the movement by plating of mercury molecules through an electrolyte gap in a column of mercury from one side to the other of the gap. The position of the meniscus of electrolyte is then a measure of time during which the plating current has persisted. Such devices are available from Curtis Instruments, Inc. of Mt. Kisco, N.Y., the present assignee of the present patent application. However, the coulometric elapsed time indicators also have some serious disadvantages including limited measurement resolution, undesirable changes in characteristics in response to changes in operating temperatures, and inherent physical limits of shock and vibration resistance.

Accordingly, it is an object of the invention to overcome one or more, and preferably all of the limitations and disadvantages of the prior elapsed time indicators as discussed immediately above.

Prior cumulative operations measurement systems which measure a count of the number of times operation is initiated (often referred to as "event counters") have frequently employed technology similar to that used in elapsed time indicators, such as pulse circuits which actuate mechanical number registers similar to the mechanical registers in automobile odometers. These prior structures have a number of the same limitations and disadvantages enumerated above for elapsed time indicators. These disadvantages include bulky size, limited numerical resolution, high cost, and considerable weight. The disadvantages also include the cumbersome procedures for recording the event count, and the requirement that different voltages and frequencies of signals to be counted and recorded must be dealt with.

Accordingly, it is another object of the invention to overcome one or more, and preferably all, of the limitations and disadvantages of prior even counters as discussed immediately above.

In accordance with the present invention, na operations measurement system is employed which makes exclusive use of solid state digital circuitry for accumulating an storing the accumulated operations in terms of digital counts. However, such a system can be very vulnerable to electrical "noise" which may be derived from the machine or apparatus for which operations are being accumulated, particularly since such a machine or apparatus may often include an electronic circuit or other components which give rise to oscillations or voltage spikes during startup.

Accordingly, it is another object of the invention to provide an operations measurement system which is remarkably free from the risk of false operation due to electrical noise on the input connections to the operations measurement system.

Further objects and advantages of the invention will be apparent from the following description and the accompanying drawings.

SUMMARY OF THE INVENTION

In carrying out the invention, there is provided a cumulative operations measurement system for connection to a source of supply voltage and operable in response to an operating voltage for accurately measuring a summation of the operations when that operating voltage is present, said system comprising a capacitor connected to be charged by the supply voltage, a voltage multiple-stage memory register connected to receive the operating voltage signals to be counted at the low order end thereof and operable to store said signals as a measure of total operations, a nonvolatile multiple-stage memory register having stages corresponding to at least some of the stages of said volatile memory register, means for detecting when the supply voltage is removed, a store sequencing means connected to be powered by the energy stored in said capacitor and connected to said last-named means and operable in response thereto to transfer the count stored in said voltile memory register into said nonvolatile memory register for storage therein, means for detecting when the supply voltage is applied, a recall sequencing means connected to said last-named means and operable in response thereto to transfer the count stored in said nonvolatile memory register into said volatile memory register.

DESCRIPTION OF PREFERRED EMBODIMENTS

Figure 1:
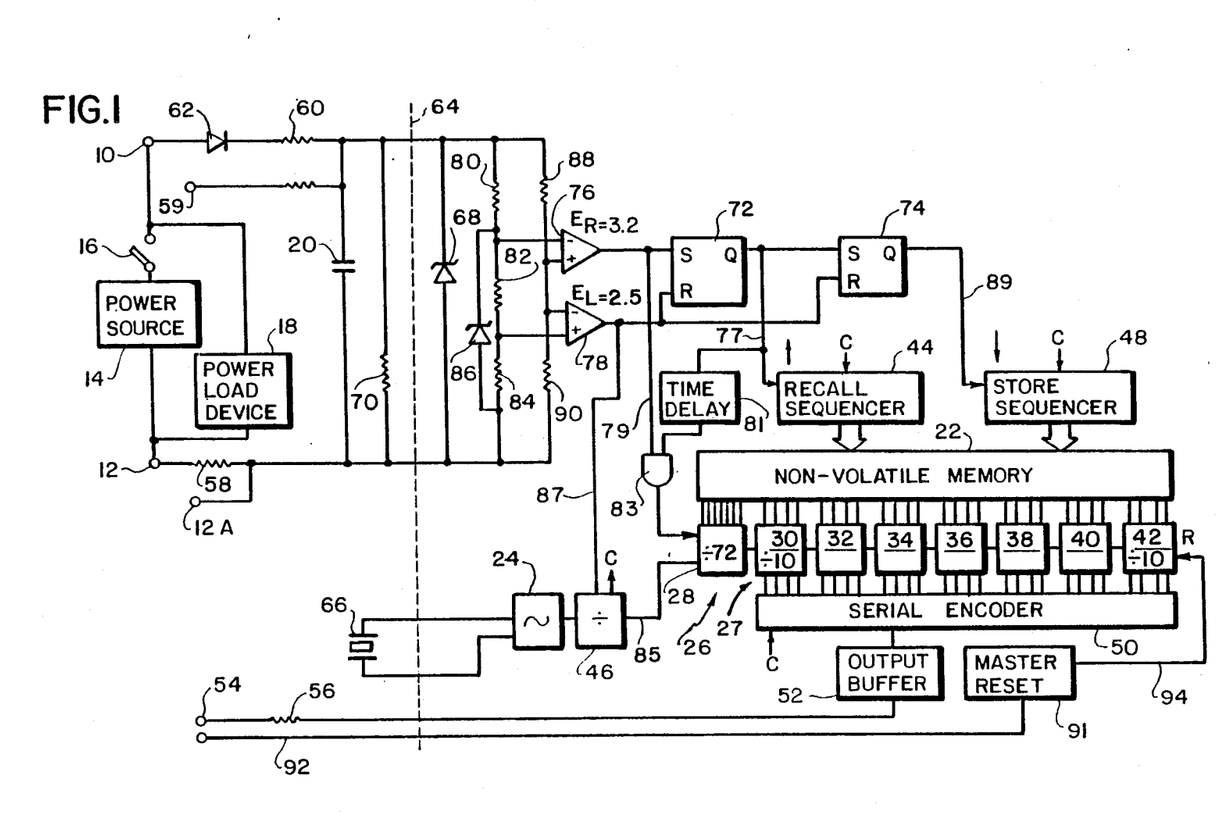
FIG. 1 is a schematic circuit diagram of a preferred embodiment of the invention which is limited to measurement of operating time.

Referring more particularly to FIG. 1, there is shown a cumulative operations measuring system which is arranged for connection through main terminals 10 and 12 to a power source 14 through a switch 16. The primary purpose of the switch 16 is to connect the power source 14 to a power load device 18. The primary purpose of the operations measurement system of the present invention is usually to determine the total operating time of the power load device 18, or a count of total operations, in order to determine when that device needs to be given periodic servicing, or to determine when that device should be replaced in order to assure reliability. The embodiment of FIG. 1 is limited to the measurement of total operating time.

The primary components of the operations measurement systems of FIG. 1 include an energy storage and filter capacitor 20, a nonvolatile memory 22, an oscillator 24, and a volatile counter memory register 26 include a series of stages 28-42 which operate as digital divider circuits. The divider circuit 28 preferably divides by a factor of 72. Each of the dividers 30-42 preferably divide by a factor of 10. The dividers 30-42 are sometimes referred to as a group comprising a decimal register 27.

When the switch 16 is closed, and the voltage comes up on the operations measurement system, a measurement number previously stored in the nonvolatile memory 22 is recalled by a recall sequencer 44 and stored in the volatile memory register 26 before commencement of the time measurement. The time is measured by means of timed pulses delivered from the oscillator 24 to the volatile memory register 26 through a divider circuit 46. When voltage is removed from the operations measurement system by opening of the switch 16 or by failure of the power source 14, the number stored in the volatile memory register 26 is stored in the nonvolatile memory 22 by the operation of a store sequencer circuit 48. The energy for this store operation is provided from the energy store capacitor 20.

In order to make the information stored in the memories available to the user, a serial encoder circuit 50 is preferably provided to read the information stored in the volatile memory register 26, and to deliver that information as a series of digitally coded pulses through an output buffer 52 to a data output terminal 54 through a resistor 56. A reading device, described below in connection with FIG. 4 may be connected to the output terminal 54, and is also connected to terminal 12 at 12A to provide a voltage reference point. The reading device is preferably also connected to a terminal 59 to provide a voltage input to the time measurement system so that the information stored in the nonvolatile memory 22 is recalled into the volatile memory register 26 by the recall sequencer 44 for read-out through the serial encoder 50, even if the system is not otherwise energized.

The volatile memory register 26 is sometimes referred to below as a volatile multiple-stage memory register, or as a counter. The nonvolatile memory 22 is sometimes referred to below as a nonvolatile multiple-stage memory register.

In series in the line from input terminal 10 there are preferably provided a series resistor 60 and a diode 62 to provide for some electrical isolation between the power source 14 and the time measurement system. In order to isolate the system for terminal 12 as well, a series resistor 58 is preferably provided in the line from that terminal. The resistors 58 and 60, together with the capacitor 20, form a low-pass filter to prevent the passage of high frequency noise signals. The diode 62 also performs the very inportant function of permitting the time measurement system to be energized by alternating current power sources 14, even though the time measurement system is basically a direct current system. The diode 62 performs another very important function in providing for isolation of the time measurement system from the impedance of the power load device 18 during the store sequence operation when the time measurement system is relying for energy upon the capacitor 20. Thus, when the switch 16 is opened, or when power source voltage drops for any other reason, the diode 62 is backbiased by the voltage from capacitor 20 so that the power load device and power source impedances are not a factor in the power down operation of the time measurement system. The resistors 58 and 60 provide the additional desirable function of reducing the risk of serious electrical shock to equipment operators and service people.

In the preferred embodiment of the invention, all of the elements illustrated to the right of the broken line 64 are preferably incorporated in a custom integrated chip, a monolithic semiconductor chip circuit which can be produced economically in large quantitites. This chip circuit is preferably implemented in CMOS (Complementary-Metal-Oxide-Silicon) technology.

The only major components external to the integrated circuit chip are the capacitor 20, the diode 62, and a crystal 66 connected to control the operation of the oscillator 24.

Within the integrated circuit, there is included a voltage limiting device 68 connected across the incoming lines to limit the maximum voltage to which the time measurement system is subjected. The voltage limiting device 68 may be a zener diode, or a device similar to a zener diode. Also, in order to provide for a predictable voltage decay characteristic when input voltage is removed from the time measurement system and while the capacitor 20 is being discharged, a discharge load circuit 70 is preferably provided across the input lines. Load circuit 70 may be an active circuit or a passive circuit such as the resistor illustrated. The load circuit 70 is important because it is often difficult to obtain predictable and reproducible loading characteristics with CMOS circuits, and the load across the capacitor 20 during discharge must be reasonably predictable to determine the correct operation and the correct timing of operation of the circuit during shut-down. The impedance of load circuit 70 may be selected, or adjusted, to compensate for the measured load impedance of the CMOS circuit chip to make the shut-down time predictable.

The recall sequencer 44 and the store sequencer 48 are respectively controlled by latch circuits 72 and 74 on the basis of signals received from voltage comparison amplifiers 76 and 78. The voltage comparison amplifiers 76 and 78 respond in part to reference voltages detected across a voltage divider network consisting of resistors 80, 82, and 84 which is referred to as a voltage reference circuit. The voltage reference circuit also inlcudes a voltage limiting device schematically illustrated as a zener diode 86 which is connected across the resistors 82 and 84 of the voltage divider network.

The voltage comparison amplifiers 76 and 78 also respond to a fraction of the terminal voltage as detected across a voltage divider consisting of resistors 88 and 90. The voltage dividers 80-82-84 and 88-90 are designed so that, as voltage initially rises following the closure of the power switch 16, the voltages supplied to the comparator amplifiers 76 and 78 from the voltage divider 80-82-84 always exceed the voltage supplied to those comparator amplifiers from the voltage divider 88-90. In other words, the ratio of the resistance of 90 to the resistance of 88 is less than the ratio of the resistance of 84 to the combined resistances of 80 and 82. This means that the inverting input of comparator 76 is initially high, and the noninverting input of the comparator 78 is initially high. This means that the initial output of comparator amplifier 78 is a logic "one", and the initial output of comparator amplifier 76 is a logic "zero".

However, as the voltage rises across both voltage dividers, there will come a time when the voltage seen by the voltage limiting device 86 across resistors 82 and 84 reaches the rated voltage of that device, the voltage drop across those two resistors is thereafter limited to the rating of the voltage limiting device 86. This means that the input voltages from the divider 80-82-84 to the threshold amplifiers 76 and 78 are thereafter held constant, while the voltage supplied to each of these comparator amplifiers from the voltage divider 88-90 continues to rise. The result is that, at some point, the voltage on the inverting input to comparator amplifier 78 exceeds the voltage on the noninverting input of that amplifier (the threshold is cross) and at a higher voltage from the voltage divider 88-90, the voltage on the noninverting input to amplifier 76 exceeds the voltage on the inverting input to that amplifier (that threshold is crossed). Thus, the output from comparator amplifier 78 first switches from a logic one to a logic zero, and then the output from comparator amplifier 76 switches from a logic zero to a logic one, as the voltage derived from the voltage divider 88-90 increases.

When the terminal voltage decreases because of the opening of switch 16, the reverse action occurs. The higher voltage comparator amplifier 76 first switches off (from logic one to logic zero), and then the lower voltage comparator amplifier 78 switches on (from logic zero to logic one). Thus, the comparator amplifiers 76 and 78 indicate the direction of voltage change by the sequence of the logical switching of those amplifiers.

The components of the voltage reference circuit 80-86 and the voltage divider 88-90 are proportioned to provide predetermined voltage switching levels. For instance, the circuits may be designed so that comparator 78 switches when the input terminal voltage level at terminals 10-12 is, for instance, about 2.5 volts, and the comparator amplifier 76 may be arranged to switch when the terminal voltage is about 3.2 volts.

The above-described outputs of the comparator amplifiers 76 and 78 operate to control the latch circuits 72 and 74, and to thereby control the recall sequencer 44 and the store sequencer 48. Upon initial startup, the logic one output from amplifier 78 is applied, as shown, to the reset input of latch 72 to maintain latch 72 reset to prevent immediate enablement of the recall sequencer 44 through connection 77. However, as the voltage rises, and the output from comparator 78 goes to logic zero, and then the output from comparator 76 goes to logic one, that logic one signal from 76 is applied to the set input of the latch circuit 72, causing latch circuit 72 to be set. This results in a positive-going edge from the Q output of latch 72 on output connection 77 to the recall sequencer 44 which actuates that sequencer to commence the recall of data from the nonvolatile memory 22 into the volatile memory register 26.

At the time the latch 72 is set, the Q output from comparator 76 on connection 77 is also supplied to a time delay circuit 81. The time delay circuit 81 provides an output to an AND gate 83 after a delay interval sufficient to permit the full operation of the recall sequencer 44. The output signal from comparator 76 at connection 79 is carried directly to AND gate 83. The combination of those inputs at AND gate 83 provides an output from that AND gate to enable the first stage 28 of the volatile memory register 26. The time delay provided by circuit 81 permits the volatile memory register 26 to commence counting pulses from the oscillator 24 supplied through the frequency divider 46 and connection 85 only after the correct prior count is safely stored in volatile memory register 26.

The frequency divider 46 is preferably disabled by the initial logic one output from comparator 78 through connection 87. However, as soon as the threshold of comparator 78 is passed, and that output becomes a logic zero, that disablement is no longer effective, and the divider 46 is operable to commence operation leading to the emission of divided pulses to the input of the volatile memory register 26 through connection 85.

The divider 46 also provides clock outputs, as schematically indicated by the letter "C", which are used to clock the operation of other components of the system such as the recall sequencer 44, the store sequencer 48, and the serial encoder 50.

The store sequence latch 74 is connected to receive the same reset signal from the comparator 78 as was supplied to the recall latch 72. The set signal to the store sequence latch 74 is derived from the Q output from latch 72 so that latch 74 cannot be set until latch 72 is set. Therefore, the store latch 74 operates in tandem with the recall sequencer latch 72 and provides a Q output signal to the store sequencer 48 at connection 89 only when a Q output is available from latch 72. However, the store sequencer 48 is operable to initiate the store sequence only on a falling edge of the Q output. Accordingly, the store sequencer is not actuated until the voltage comes down, as detected by the comparators 76 and 78, to reset the latch 74. Since the latches 72 and 74 operate in tandem, and since the recall sequencer 44 responds only to the rising Q signal and the store sequencer responds only to the falling Q signal, in the embodiment of FIG. 1, latches 72 and 74 may be combined in a single latch.

The system also preferably includes a master reset circuit 91 which is normally supplied with a logic zero input signal at an input connection 92, and is inoperative in the presence of that signal. However, upon the reception of a logic one signal, the master reset circuit 91 is operable to issue a reset signal at connection 94 to reset all of the counters of the volatile memory register 26. This may be used to initialize the system, or reinitialize the system to zero. For instance, the volatile memory register 26 may be reset by the master reset circuit 91, and then the system is immediately shut down, causing the store sequencer 48 to operate to store the zero count in the nonvolatile memory.

Figure 2:
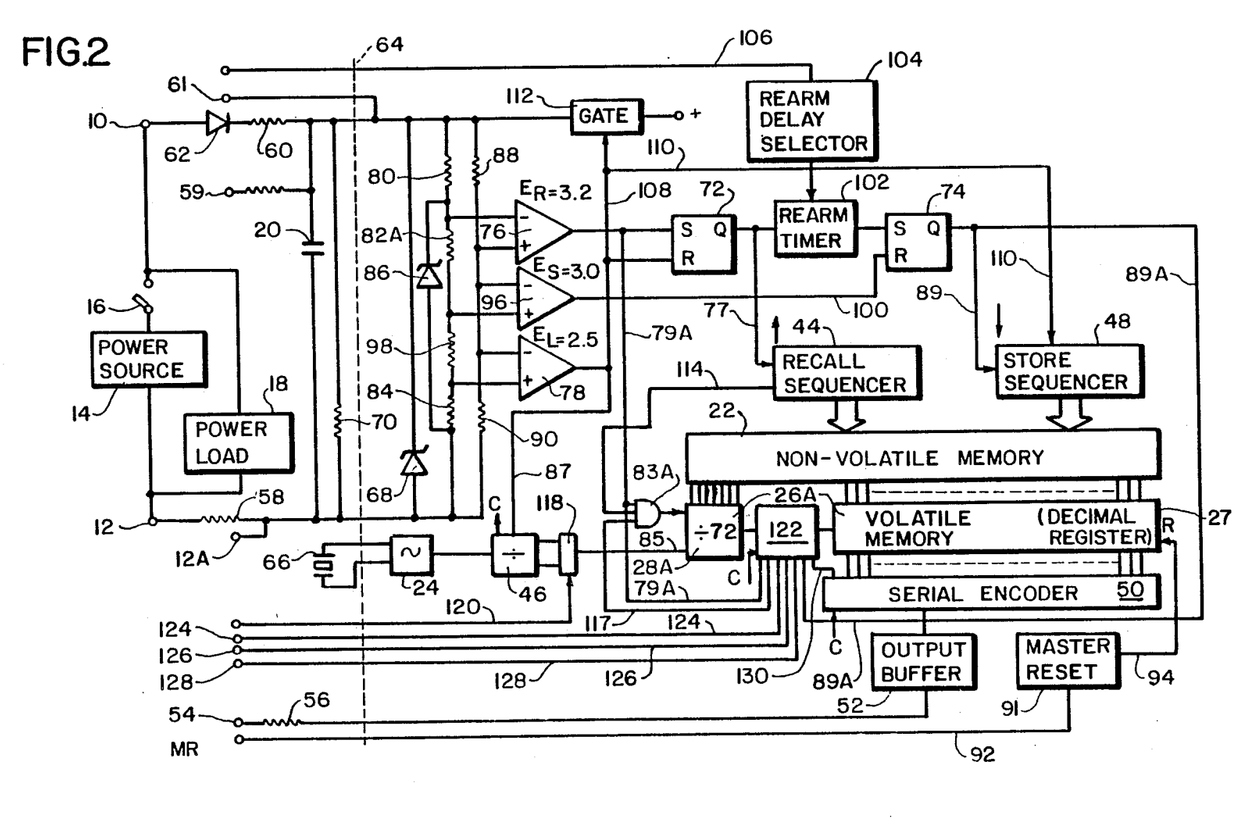
FIG. 2 is a schematic circuit diagram of a second preferred embodiment of the invention which is capable of measuring cumulative operating time or a cumulative count of events.

FIG. 2 is a modification of the embodiment of FIG. 1 which includes substantial refinements over the system of FIG. 1, and which represents the preferred embodiment. All of the components which directly correspond to similar components in FIG. 1 have been correspondingly numbered, except that the divider circuits 30-42 are not separately shown but are shown combined as the decimal register 27. The features of FIG. 2 which correspond exactly with those of FIG. 1 are not further described in detail in connection with FIG. 2. Rather, the following explanation of FIG. 2 concentrates on the features which are different from those shown in FIG. 1.

One of the most important differences in FIG. 2 is that an additional threshold circuit 96 has been added which responds to an input terminal voltage intermediate between the terminal voltage for the lower threshold comparator 78 and the upper threshold comparator 76. For instance, if the lower threshold comparator 78 responds to the condition of 2.5 volts at the input terminals 10-12, and the upper threshold comparator 76 responds to the condition of 3.2 volts at the input terminals 10-12, then the intermediate threshold may respond to a voltage of 2.9 volts at the input terminals 10-12. In order to accomplish this, an additional resistor 98 is provided in the voltage reference voltage divider 80-82-84. The resistor 82 must be modified in value, as signified by the designation 82A, to accommodate for the resistor 98 so that the sum of the resistances of resistors 82A and 98 is equal to the former resistance of 82 alone.

The intermediate threshold circuit 96 is used to power the reset input of the store sequencer latch 74 through connection 100. On startup, the comparator circuit 96 is at a logic one, holding latch 74 reset, as before. This continues until the threshold of 2.9 volts is exceeded, at which time comparator circuit 96 switches to logic "zero", and the reset signal is removed from latch 74. However, in this modified embodiment of FIG. 2, the store sequencer latch 74 is not immediately set when the voltage exceeds the threshold of 3.2 volts, the threshold of comparator circuit 76. Instead, the "set" output from the recall latch 72 is carried to a rearm timer 102, and only after that rearm timer times out, is a "set" signal supplied from the rearm timer to the "set" input of store latch 74. Only after the rearm timer 102 has timed out, and the latch 74 has been set, can the latch 74 be reset in order to provide a negative-going voltage front to energize the store sequencer 48 through connection 89.

The purpose for the above-described arrangement is to prevent unnecessary and inconsequential operations of the store sequencer 48 in response to very rapid fluctuations of the input terminal voltage which can occur because of a faulty switch 16, or for other reasons. It will be understood that the switch 16 may often be implemented as a solenoid operated electrical contactor. Such contactors are subject to problems such as contact "bounce". Also, under conditions of vibration or mechanical shock, or low voltage conditions, such contactors may be subject to erratic operation. The rearm timer 102 is designed to avoid these problems by preventing the "arming" of the store sequencer latch 74 unless the input voltage is sustained for the interval for which the rearm timer is designed. The rearm timer may be designed to provide any desired delay interval in the rearming of latch 74. For instance, that interval may be in the order of four seconds. In a preferred embodiment, however, the delay interval of the rearm timer 102 may be changed by a rearm delay selector circuit 104 which may be controlled by a signal on an associated line 106. The change may be from four seconds to one second, for instance. Alternatively, if desired, the rearm delay selector may be designed with two or more control signal lines to select any one of four or more different delay intervals.

The rearm timer 102 is designed to automatically reset whenever the Q output from latch 72 goes to logic zero as latch 72 is reset. Accordingly, if the input voltage is present only momentarily, the rearm timer never has a chance to time out to arm the store sequencer latch 74, and the store sequencer therefore is never actuated.

This is extremely important because the circuit is most economically and conveniently implemented in CMOS (Complementary-Metal-Oxide-Silicon) technology, and nonvolatile memories, such as memory 22, implemented in CMOS technology have a limited "write" cycle life. Accordingly, it is very important to avoid actuation of the store sequencer 48 which requires the storage of data in the nonvolatile memory 22 if that operation is inconsequential.

As an additional precaution, in order to avoid premature acutation of the store sequencer 48, the logic one output from comparator 78 under initial low voltage conditions is carried through a connection 108 and 110 to the store sequencer 48 as a disablement signal. This disablement signal is then removed as soon as the threshold of comparator 78 is passed at 2.5 volts as the voltage of the system increases. The voltage on connection 108 is also preferably connected to disable a gate circuit 112 which prevents power from being applied to the remainder of the circuit until the 2.5 volt threshold is passed as voltage increases. Gate circuit 112 illustrates the principle that most of the circuit does not become active before the terminal voltage reaches 2.5 volts. However, this result may also be achieved in other ways, such as by direct logic switching of each circuit element by the output signal on connection 108 from comparator 78. Comparator 78 is specially designed to provide a very reliable and consisten logic one output over the range from the very lowest input voltage up to 2.5 volts to reliably keep the rest of the circuit disabled until the 2.5 volt threshold is reached. This prevents the system from malfunctioning, and particularly guards against malfunctions arising from faulty power supply systems which may be very slow to come up to rated voltage.

Another major difference in the system of FIG. 2 from the system of FIG. 1 is that instead of the time delay 81 to delay the operation of the volatile memory register 26 until the completion of the operation of the recall sequencer 44, the completion of the operation of the sequencer 44 is signalled by an output at a connection 114 which actuates an AND gate 83A to provide an output to enable the volatile memory register 26. Another input to the AND gate 83A is through a connection 79A from the output of the threshold circuit 76. A third input at 117 is a logic "one" when the system is measuring time, as discussed more fully below. The result of this circuitry is that the counter 26A is not enabled until the upper threshold voltage value of 3.2 volts is exceeded to provide an enabling signal on connection 79A to the AND gate 83A, and the output signal appears from the recall sequencer 44 on connection 114 to the AND gate 83A.

It is very desirable for purposes of testing to provide for the possibility of a speeded up operation of the system. For this purpose, a countdown rate selector circuit 118 is preferably provided which is connected to receive and select a higher frequency from the frequency divider 46 to provide for fast operation of the volatile memory register 26. The selector circuit 118 is preferably actuable for selecting the higher frequency by a signal selectively applied through a connection 120.

Another extremely important difference in the embodiment of FIG. 2 over that of FIG. 1 is the provision of a circuit 122 connected between the divide by 72 divider 28A and the decimal register 27 of the volatile memory register 26A for converting the operations of the circuit from a cumulative operations measurement system to a cumulative event counter system. Accordingly, circuit 122 is referred to as a "conversion circuit" or as a "programmable conversion circuit". Conversion circuit 122 receives the threshold signal from threshold circuit 76 through connection 79A. Conversion circuit 122 also receives a store latch output from the Q output of store latch 74 on connection 89A. Conversion circuit 122 also receives clock signals from frequency divider 46 as indicated in the drawing by the input marked "C". Additionally, the conversion circuit 122 receives programming and information signals on three outside terminal connections 124, 126, and 128.

When the system is operable to measure cumulative operating time, the circuit 122 provides a logic one output at connection 130 to the serial encoder 50. This adds an additional "bit" of data to the information supplied through the serial encoder 50 and the output buffer 52 when the data is read. That additional logic one bit tells the reader that the system is operating to measure cumulative operating time, rather than a count of events. If the system is operating to count events, the output at connection 130 is a logic zero, thus distinguishing the readout to the reading system as an event count rather than operating time.

When the terminal connections 124, 126, and 128 do not receive any voltage inputs (logic zero), the conversion circuit 122 is in the operating time measurement mode, and the operation of the system is consistent with the above-described operation of FIG. 2. When various combinations of logic one signals are applied to the input connections 124, 126, and 128, the conversion circuit 122 converts the system to operate as either a "two wire" or "three wire" event counter. In the context of this specification, a two wire event counter is defined as an event counter which counts "power-on" events. A three wire event counter is a counter which is continuously energized and which counts events in terms of electrical event signals which are separate from "power-on".

Figure 3:
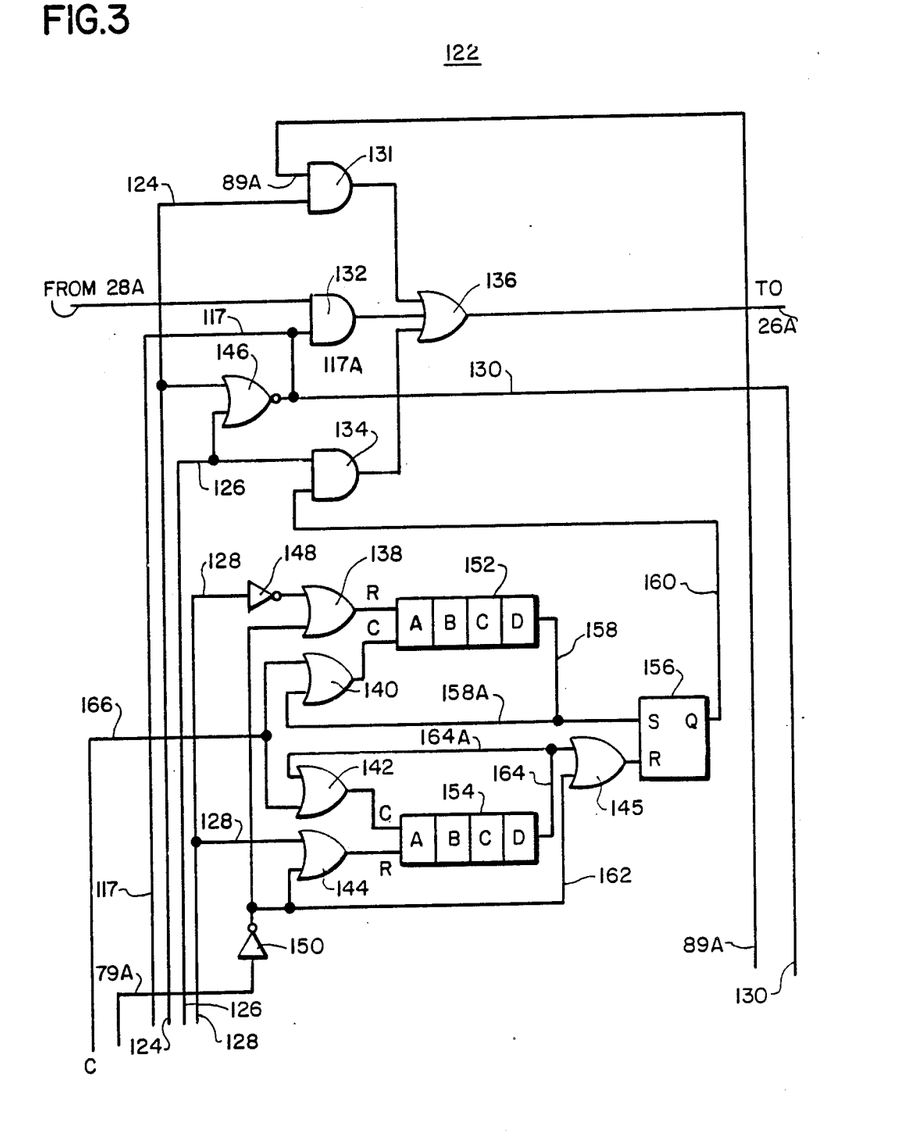
FIG. 3 is a schematic circuit diagram of a conversion circuit which forms a part of FIG. 2 for selectively converting the system to operate to record either elapsed time or a count of events.

FIG. 3 is a schematic circuit diagram which shows details of the conversion circuit 122. The circuit includes digital logic switching elements including AND gates 131, 132, and 134, OR gates 136, 138, 140, 142, 144, and 145, a NOR gate 146, and inverters 148 and 150. Also included are counters 152 and 154, and a latch circuit 156.

The counter circuits 152 and 154, and the associated logic elements provide a digital filter when the system is used as a three-wire event counter, as will be described more fully below.

As previously mentioned above, when logic zero inputs are provided upon all three of the control inputs 124, 126, and 128, the system operates as an operating time measurement system. Under those operating conditions, the logic zero at connection 124 disables the AND gate 131 and, together with the logic zero from 126, enables the NOR gate 146 to provide a logic one output at a connection 117A to enable the AND gate 132. This enablement of AND gate 132 provides for a free flow of pulses received from the divider circuit 28A through AND gate 132 and through the OR gate 136 to the decimal register 27. The logic one from NOR gate 146 is also supplied through the common connection 130 to provide the logic one signal previously described to the serial encoder 50 of FIG. 2 to signify that operating time is being measured by the system. The logic one is also supplied through connection 117 to the AND gate 83A shown in FIG. 2 so that the AND gate 83A is not disabled from responding to the other two input signals to that AND gate as described above for FIG. 2.

The logic zero signal on connection 126 also disables AND gate 134 so that no signals from the latch circuit 156 on connection 160 are gated through to the OR gate 136. Accordingly, because of the disablement of both of the AND gates 131 and 134, the OR gate 136 responds exclusively to the operating time signals received through AND gate 132 from the divide circuit 28. The continuous logic zero signal on connection 128 provides a logic one output from the inverter 148 to OR gate 138 which resets the counter 152 and prevents that counter from counting up. Accordingly, the output of counter 152 never appears at the output connection 158 to set the flip-flop 156 to provide a logic one output from the flip-flop on connection 160.

As the system is initially energized, latch circuit 156 is provided with a reset signal through OR gate 145 by means of a signal supplied to that OR gate through connection 162 and inverter 150. Inverter 150 is supplied with an initial logic zero signal through connection 79A from the threshold compare circuit 76 of FIG. 2. When the system comes up to voltage, that signal becomes a logic one, with the result that a logic zero is then available on connection 162 to OR gate 145. However, under the operating conditions just described, there is no signal available to set the latch circuit 156. As will appear from the later description, the counter 154 will be energized to count up, eventually providing an output on connection 164 to provide another reset signal through OR gate 145 to the latch circuit 156.

When a logic one is provided to control connection 124, with connections 126 and 128 remaining at logic zero, the conversion circuit 122 operates to convert the system to a two wire event counter. The logic one connection may be provided to connection 124 by connecting a jumper between terminal 124 and terminal 61 in FIG. 2. In that operating condition, the conversion circuit 122 operates as before, except that AND gate 131 is enabled by the logic one signal on connection 124, and AND gate 132 is disabled by the logic one signal on connection 124 as inverted by the NOR gate 146. Thus, a logic zero signal appears on the output of NOR gate 146 at connections 130, 117A, and 117. The disablement of AND gate 132 injhibits any delivery of pulses from the divider circuit 28A to the OR gate 136. The enablement of AND gate 131 permits a logic one signal supplied through connection 89A to be passed through the OR gate 136 as an output to the decimal register 27. The logic one signal at connection 89A is an output from the store sequence latch 74 which signals the timing out of the rearm timer 102 of FIG. 2. Thus, in this mode of operation, as a two wire event counter, the system records one count for each power-up operation which continues long enough to time out the rearm timer 102. The operation of the rearm timer is described above in connection with FIG. 1.

The logic zero output from NOR gate 146 supplied on connection 130 is carried to the serial encoder 50 of FIG. 2 to indicate, as a part of the readout information, that event counts are being measured rather than operating time. The logic zero from NOR gate 146 is also supplied through connection 117 to the AND gate 83A of FIG. 2 to thereby disable the divider circuit 28A. Since the outputs of that divider circuit 28A are not being used, there is no need that the divider circuit should be in operation, and energy is saved by the disablement. Also, if the divider circuit 28A is not disabled, then it may eventually wear out, resulting in a possible further increase in needless current drain. As the voltage of the system is brought up for each event which is to be counted, a logic one signal first appears at connection 124, which is operable through the NOR gate 146 to disable the AND gate 132 before the operation of the threshold circuit 76 of FIG. 2 to initiate the operation of the recall sequencer 44 through the recall sequence latch 72. This assures that no operating time measurement signals from the divider circuit 28A of FIG. 2 can be gated through the conversion circuit 122 when the system is intended to be operated as a two wire event counter.

When the system is to be used as a three wire event counter, the input on connection 124 is maintained at logic zero, the input at connection 126 is maintained at logic one, and a count is made of events on the basis of logic one signals applied to connection 128. Under these operating conditions, the AND gate 131 is disabled so that the operation of the rearm timer 102, as detected by a signal at connection 89A has no effect on the count. However, the logic one signal at connection 126 does enable AND gate 134 so that logic signals supplied from the digital filter including counter circuits 152 and 154 through connection 160 are gated through the AND gate 134 to the OR gate 136 to be counted in the decimal counter 27. At the same time, the logic one signal at connection 126 operates through the NOR gate 146 to provide a logic zero on connections 130, 117A, and 117. This logic zero signal removes the logic one marker on connection 130 as supplied to the serial encoder, disables the AND gate 132, as previously described, and disables the AND gate 83A of FIG. 2 to turn off the divider 28A as previously described.

As previously described above, on startup of the system, the latch 156 is reset so that no signal (a logic zero) appears on connection 160. However, as previously described, as the voltage comes up, the logic one threshold signal on connection 79A operates through the inverter 150 to carry the connection 162 to a logic zero, thus removing the reset signal supplied to latch 156 through OR gate 145. However, no set signal is immediately applied to latch circuit 156. The initial logic one output from inverter 150 is also carried to OR gates 144 adn 138 to maintain the counters 154 and 152 reset and inoperative. However, when the signal at connection 79A comes up to logic one, and the output of inverter 150 goes to logic zero, the OR gates 144 and 138 no logner receive that signal, and are free to respond exclusively to the signals derived from connection 128.

Upon the appearance of a logic one signal to be counted at connection 128, that signal is inverted by the inverter 148 to remove the other source of a reset signal supplied through OR gate 138 to the counter 152. This permits the counter 152 to be counted up in response to clock signals supplied from a clock input connection 166, and through the OR gate 140. At the end of a time delay interval determined by the number of stages in counter 152 and the frequency of the clock signal on connection 166, the counter 152 times out to provide a logic one signal on connection 158 to set the latch 156 to thereby provide a pulse to be counted through the connection 160, the AND gate 134, and the OR gate 136. At the same time, the logic one output is carried back on a branch connection 158A to another input of the OR gate 140 to lock the counter 152 in the full count condition until such time as it is reset.

In the meantime, the logic one signal on connection 128 has been operating through OR gate 144 to reset the counter 154 (or to keep that counter reset) so that no reset signal is available to the latch circuit 156 from the counter 154.

When the input signal on connection 128 changes from logic one to logic zero, the inverter 148 provides a logic one signal to OR gate 138 to reset the counter 152 to remove the set signal from latch 156. The logic zero signal on 128 is also supplied to the OR gate 144 to remove the reset signal from counter 154. Counter 154 then counts up in response to the clock signals at connection 166 received through OR gate 142. Accordingly, if the logic zero condition persists for long enough to count out the counter 154, a logic one eventually appears at connection 164 which locks up the counter 154 through connection 164A and OR gate 142, and which also operates through OR gate 145 to reset the latch 156. Thus, the logic one output from latch 156 at 160 is removed.

From the above description, it will be appreciated that the circuit including the counters 152 and 154 operates as a digital low-pass filter. Thus, if a logic one signal does not persist long enough to allow counter 152 to count out to set the latch circuit 156, then the counter is immediately reset by the next logic zero signal, and the latch 156 is never set, and the short interval logic one signal therefore is not counted. Similarly, when a logic one signal which persists long enough to be counted is terminated by a logic zero signal, that logic zero signal must persist for an interval long enough to count out counter 154 in order to reset the latch 156. If the interval is shorter than that, the counter 154 is reset without resetting the latch 156. Thus, there is no separate subsequent setting of the latch 156 to be counted since the latch 156 remains in the set condition. On the other hand, if the logic zero condition persists long enough to count out the counter 154, then the latch 156 is reset, and the system is ready to count another logic one condition which persists long enough to count out the counter 152. It is understood that only rising voltage wavefronts are counted through the connection 160, the AND gate 134, the OR gate 136, and the register counter 27 of FIG. 2.

In FIG. 1 and FIG. 2, the actual voltages at which the various threshold circuits 78, 96, and 76 are operable are not extremely critical, as long as the voltages are adequately spaced apart and are arranged in ascending order from the threshold comparator circuit 78 to circuit 96 to circuit 76. In other words, the values of 2.5 volts, 2.9 volts, and 3.2 volts for these thresholds discussed above were simply by way of example. Preferably, however, the highest threshold, that of comparator 76, (sometimes referred to below as $E_R$) should be in a range from 2.9 volts to 3.4 volts at an operating temperature of 30 degrees Centigrade. The next threshold voltage at comparator 96 (sometimes referred to below as $E_S$) is preferably in a ratio of 0.87 to 0.95 of $E_R$. The third threshold voltage at comparator 78 (sometimes referred to below as $E_L$) is preferably in the range between 0.75 $E_R$ to 0.82 $E_R$. It will be understood that these voltages are not the actual voltages at the comparator circuits, but represent the values of the terminal voltages across terminals 10 and 12 at which the comparator circuits 78, 96, and 76 are operable.

While the above discussion of the operations of the comparator amplifiers 76, 96, and 78 is based on the concept of providing three different reference voltages from the reference voltage circuit 80–86, and only a single fractional value of the input voltage from the voltage divider 88 and 90, it will be understood that, if desired, a single reference voltage may be supplied from a simpler reference voltage source, and the three different thresholds may be provided by having a more elaborate voltage divider 88–90, with intermediate resistors to measure different fractions of the input voltage against the single reference voltage. It will be understood that in the integrated circuit chip structure, the voltage dividers such as 80–84 and 88–90 may be carried out as transistorized synthetic resistors, or as switched capacitor dividers instead of resistors.

In the operation of the FIG. 2 embodiment, when the voltage first comes up on the system, and the rearm timer 102 is started, if the voltage is interrupted or decreases drastically before the rearm timer times out, resulting in the reset of the rearm timer, there is no saving of the time interval measurement which occurred during the fraction of the total rearm timer interval during which the rearm timer was timing before reset, since the store sequence latch was not set (or rearmed) and the store sequencer 48 was consequently not actuated. However, this loss of timing data is not serious because it is assumed that such a short term actuation was a "false" actuation which is not to be counted. Also, presumably it will not occur often.

However, it is one of the most interesting and valuable aspects of the FIG. 2 embodiment of the invention that the timing data taken during the first four seconds of operation of the apparatus during which the rearm timer is timing out is counted in the volatile memory register 26A during those entire four seconds. If the rearm timer does time out to rearm the store sequence latch 74, which is the usual circumstance, that entire four seconds of timing data is saved utlimately by operation of the store sequencer 48 when it transfers the counting data from the volatile memory register 26A into the nonvolatile memory 22. Thus, while there is a delay in the full operation of the system occasioned by the operation of the rearm timer 102, no data is lost during that delay interval of four seconds (or one second) except in the unusual situation where the operating voltage decreases before the rearm timer times out.

The crystal 66 is preferably a standard clock or watch crystal adapted for operation of the oscillator 24 at 32,768 hertz. The divider circuit 46 preferably divides the frequency from the oscillator 24 by a factor of two to the fourteenth power. That division results in pulses to the first stage of volatile memory register 26 (or 26A) on connection 85 at a ½ second rate. The divide by 72 stage 28 (or 28A) then divides the ½ second pulses to one hundredths of an hour. Thus, the pulses applied to stage 30 (the lowest order stage of decimal register 27) occur at each one hundredth of an hour interval (every 36 seconds). With seven stages, as illustrated in the drawing FIG. 1, the system is capable of indicating all units of time from 1/100th of an hour up to units of ten thousand hours for a total count of 99,999.99 hours.

This is a remarkable combination of range and precision in measurement and indication. The actual measurements are made and saved with even greater precision, down to ½ second. Even smaller time increments may be saved, if desired. In order to improve the precision with which time intervals are measured, all of the measurements of the stage 28 (28A) are saved in the nonvolatile memory 22 by the operation of the store sequencer, and are recalled from the nonvolatile memory to the volatile memory register 26 (26A).

As pointed out at the beginning of this specification, the prior art electromechanical elapsed time indicators are typically expected to start their measurement operation within five seconds after the first presence of the operating voltage. By contrast, in the present invention, the operation of the counter and the time measurement system begins within a fraction of a second after power is applied to the system. Furthermore, even this fraction of a second delay in the start of the system can be compensated for by arbitrarily adding a time interval to the measured time within the combination of the frequency divider 46 and the memory register divider stage 28 (28A) of the memory register counter 26 (26A).

The chief source of error on startup of the system is the delay occasioned by the initial charge of capacitor 20. There is also a source of error in the turnoff of the system, in that the voltage of the system must fall to the nominal 3.2 volts at the comparator circuit 76 before the volatile memory register 26 (26A) is stopped by removal of the enablement signal applied through connection 79 (79A) and AND gate 81 (81A). These combined delays, plus a digitization error of an average of ¼ second are preferably all completely compensated by arbitrarily adding the correct number of milliseconds into the volatile memory register 26 (26A) on each startup of the system to theoreticaly obtain an accuracy which is within a few milliseconds of being absolutely correct. This provides an important improvement over the prior art because the startup and shutdown errors in the prior art devices lead to very substantial cumulative errors, depending upon how many startup events are encountered.

An important advantage and principle of this invention is that the system can be designed to respond with just as much or just as little delay as desired, in order to recognize or disregard events which occur quickly. This advantage was not available with prior art elapsed time indicators or event counters.

The entire volatile memory register 26 (26A) is implemented in binary digital circuitry. This means that the divide by 72 stage 28 (28A) incorporates seven binary stages, and each of the divide by ten decimal stages 30–42 includes four binary stages. In the decimal divider stages 30–42, a conventional binary to decimal coding may be employed. Thus, when the combination of four binary stages of one decimal stage such as circuit 30 counts up to ten, it sends a "carry" to the next decimal stage and reset all of its own binary stages to zero.

It will be understood that it is not absolutely essential that this decimal coded binary system by employed in carrying out the present invention. Thus, some economy in structure can be obtained by using a straight binary counting memory register for register 26 (26A).

However, the binary coded decimal arrangement provides a slightly increased efficiency in the operation and structure of the reader, and is therefore desirable for that purpose.

As previously mentioned above, when the system is implemented in CMOS, with a CMOS non-volatile memory, it is extremely important to avoid any more "write" cycles than necessary because of the limited "write" cycle life. Accordingly, it is preferable to fabricate the lowest order stages of the volatile memory 26, (26A), and the nonvolatile memory 22 to reduce the number of changes in state required when storing the achieved count in the nonvolatile memory 22. Thus, for instance, a so-called five stage Johnson counter may be used for the lowest decimal order of the decimal register 27 instead of a binary coded decimal counter. The five stage Johnson counter employs five flip-flops instead of four, and operates in a manner similar to a shift register rather than to a straight counter. In similar fashion, the first decimal register section may be implemented as a ten-position shift register. Similar expansion may be made in the divide by 72 circuit 28 (28A) and the associated portion of the nonvolatile memory 22 in order to reduce the number of changes of state in the individual binary elements of the nonvolatile memory.

It is an interesting and important aspect of the preferred embodiments as shown in FIGS. 1 and 2, and particularly in FIG. 2, that while the system for recording operations in basically a digital system, which could easily be subject to erroneous operation in response to noise signals, particularly high frequency noise signals, the system is very thoroughly protected by both analog and digital filtering, and sequence control circuits. Thus, the capacitor 20 and the associated resistors provide a low-pass input filter, the operation of the threshold circuits 76, 96, and 78 provide for a careful voltage sequence control to avoid ambiguities about the meaning of changes in voltage levels, and the rearm timer 102 filters or protects the system against spurious short term "on" detection.

Figure 4:
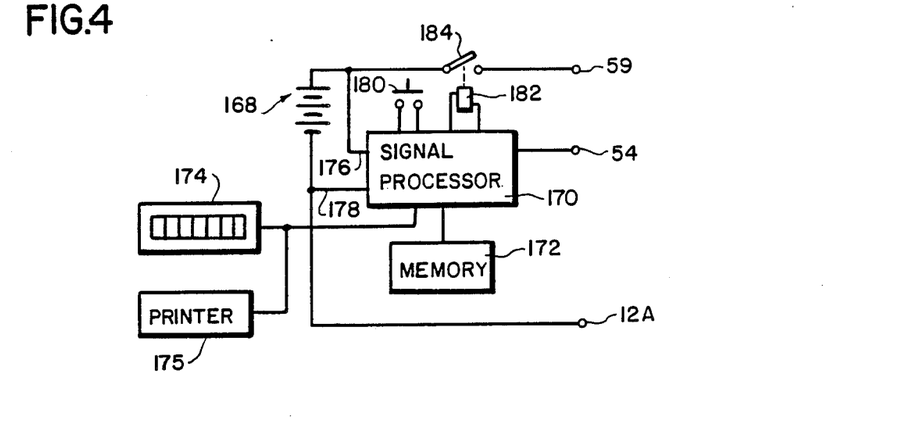
FIG. 4 is a schematic circuit diagram of a preferred embodiment of a reader system for reading the measurements recorded by the system of FIG. 1 or the system of FIG. 2.

In accordance with the present invention, a reader must be provided for reading the data stroed in the memories 22 and 26 (26A). FIG. 4 is a schematic illustration of a suitable reader for this purpose. The reader of FIG. 4 includes a power source indicated by a battery 168, a signal processor 170, a memory 172, and a digital readout display device 174. A printer 175 may also be included.

The signal processor is connected at connections 176 and 178 to receive power from the power source 168. The reader is connected to the system of FIG. 1, or to the system of FIG. 2 at terminals 59, 54, and 12A of those systems. Those terminals are given the same numbers in FIG. 4. Terminal 59 is a terminal by which the system of FIG. 1 or the system of FIG. 2 is provided with power to take care of the contingency that power is not being applied to the system of FIG. 1 or FIG. 2 at the time a reading is to be taken. Terminal 12A is a power return or ground connection. Terminal 54 is the data readout terminal. The reader system of FIG. 4 preferably includes a momentary contact pushbutton 180 which is connected to the signal processor 170 to initiate a reading operation. Signal processor 170 is connected to energize the winding 182 of a relay including a normally open contact 184 to apply power to the measurement system to which the reader is connected. It will be understood that an electronic power switch may be employed instead of the relay 182-184. The signal processor 170 is operable to energize the relay 182-184, and to initiate a reading operation, whenever the start button 180 is closed.

Figure 5:
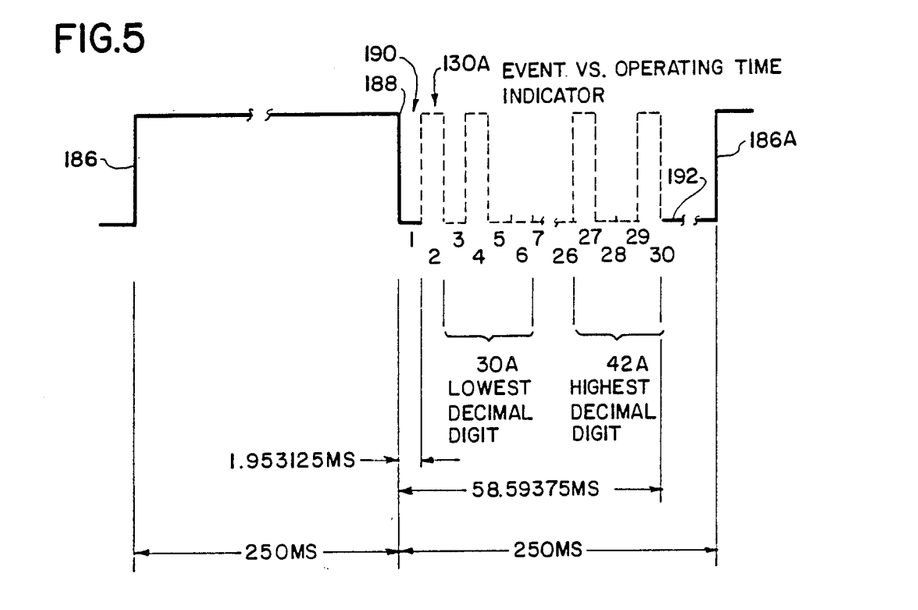
FIG. 5 is a timing diagram illustrating a preferred timing sequence of the data available for readout available to the reader system of FIG. 4 from the measurement apparatus of FIG. 2.

The systems of FIGS. 1 and 2 are designed to provide a continuous stream of serially encoded data at the data read terminal 54 whenever those systems are energized. The signal processor 170 of the reader (FIG. 4) receives and recognizes that stream of data, stores the data in memory 172, and displays the data on a visual display device 174, or prints the data on printer 175. A preferred format of the stream of data is shown in FIG. 5, and described in more detail below.

In operation, at a suitable interval after the start button 180 circuit is closed, and the power circuit is completed by the relay 182-184, the signal processor 170 starts to look for, and recognize, the stream of output data from the system of FIG. 1 or the system of FIG. 2. A single valid set of serial readout data may be recognized and stored, or preferably two or three or more sets of data may be received and recorded and compared for verification. The system then shuts itself off, opening the power relay 182-184. This operation typically occurs in less than four seconds. To the system of FIG. 1 or FIG. 2, the energization through connection 59 appears to be the start of an interval to be timed, or an event to be counted. According, the entire system of FIG. 1 or FIG. 2 is energized in the usual manner. The diode 62 isolates the power system of the reader from the impedence of the power load 18, so that power from the reader is supplied exclusively to the measurement system.

When used with the system of FIG. 2, the reader power, being on for less than four seconds, does not last long enough for completion of the operation of the rearm timer 102. Accordingly, the store sequencer 48 is not energized when power is removed. This is appropriate since the time interval during which the reader is connected to the system of FIG. 2 should not be recorded as additional operating time. However, the power from the reader is operable to energize the recall sequencer 44 to cause the data stored in the nonvolatile memory 22 to be transferred into the volatile memory register 26 (26A), and to energize the serial encoder 50 and the output buffer 52 so that the data transferred into the volatile memory register 26 (26A) is available to the reader.

If the system of FIG. 1 or the system of FIG. 2 is active at the time the reader is connected and turned on, the supply of power from the reader is of no consequence, and the data reader operates just as before to read the available stream of data from output buffer 52.

Typically, the three connections for terminals 59, 54, and 12A of the reader are carried out by means of a three pronged electrical plug connector which engages an associated three pronged jack on the system of FIG. 1 or the system of FIG. 2. Thus, one reader device may be sequentially plugged into many different operating measurement systems for taking readings at each one. Alternatively, the reader device may be dedicated to taking readings from an individual measurement system, and may be permanently wired and connected as a permanent part of that system, such as the system of FIG. 1 or FIG. 2.

In another alternative, the reader of FIG. 4 may be expanded to include a memory 172 which is capable of storing many different readings for many different measurement systems, and the reader may be permanently wired to many differnt operating measurement systems and may include multiplex switching apparatus for taking and recording sequential measurements from the various different operating systems.

It will be understood that the display device 174 may not be required when the printer 175 is provided.

While not illustrated in full in FIG. 2, the decimal register portion 27 of the volatile memory register 26 (26A) which is read out by the serial encoder 50 preferably includes about seven decimal digits, just as illustrated in the embodiment of FIG. 1. In the preferred embodiment, when the system is used as an operating time measurement system, the lowest order digits are hundredths of an hour and tenths of an hour. Accordingly, a decimal point is placed between the second-to-lowest order digit and the third-to-lowest order digit in the readout in the display register 174 and in printer 175. However, when the system of FIG. 2 is operated as an event counter, the smallest unit measured is one event. Therefore, the lowest order digit is used to store unit events. Accordingly, the reader of FIG. 4 is preferably designed to recognize whether the system is being used to measure events or operating time, and to omit the decimal mark for events, and to insert the decimal mark for operating time measurements. The reader distinguishes between the operating time measurements and the event measurements by the presence or absence of the binary bit provided from the conversion circuit 122 at connection 130 in FIG. 2. Thus, if a binary one is present in that portion of the readout from the serial encoder, it signifies an operating time measurement, and the decimal point is inserted. In the absence of that binary one signal, no decimal point is inserted.

It is also possible to include a "read only memory" within the serial encoder 50 which is programmable to carry a unique serial number for each operations measurement system so that the serial number is carried out to the reading device along with the operations data. This is valuable when the reading device is reading operations data for many different operations measurement systems.

FIG. 5 is a timing diagram indicating a preferred format in which the readout data is presented by the serial encoder 50 and the output buffer 52 to the reader of FIG. 4. Time intervals are indicated in this diagram in milliseconds. Each data readout cycle begins with a positive-going signal voltage front as indicated at 186. That signal continues for an interval of 250 milliseconds, indicating a constant logic one signal up to the point in time indicated at 188. At that point, the voltage drops to a logic zero level for a first interval of 1.953125 milliseconds, as indicated at 190. The available data is then read out and indicated by the presence or absence of logic one signals over a series of intervals numbered 2 through 30, each of such time intervals being equal to the time interval of 190. The first binary bit at interval 2, indicated at 130A, provides an indication as to whether the system is being used as an operating time measurment system or as an event counting system. As previously mentioned, a logic one indicates that operating time is being measured.

Bit positions 3, 4, 5, and 6 provide the decimal value of the lowest decimal digit, as indicated by the bracketed group labeled 30A. Bit positions 27, 28, 29, and 30 indicate the condition of the highest decimal digit, as indicated by the bracketed group 42A. The five intermediate decimal digit binary bits are not shown in the drawing. However, they occupy binary bit positions 7-26. At the end of bit position 30 (after 58.59375 milliseconds), the signal level remains at logic zero until an interval totaling 250 milliseconds from point 188. This is indicated at 192 in the drawing. At that point, another data cycle begins with a rising voltage wave-front 186A corresponding to wavefront 186.

It will be understood that other output signal formats could be employed without departing from the spirit of the invention.

The system of FIG. 2 has been described as a system which may be used as an operating time measurement system, or as an operating event measurement system. It will be understood, of course, that the principles taught by the disclosure of FIG. 2 may be employed to provide simplified systems which are dedicated to a single purpose such as measurement of operating time, or measurement of events (two wire), or measurement of events (three wire). In such simplified systems, only as much of the conversion circuit 122 as is required need by retained. For instance, the conversion circuit 122 (FIG. 3) may be omitted entirely if the system is to be operated to measure operating time. If the system is to be operated to measure a count of events (two wire), then the digital filter apparatus of the conversion circuit 122 may be deleted. Also, for the event counter functions, the divide by 72 circuit 28A may be omitted, as well as the AND gate 83A. Thus, each specialized system is considerably simplified with respect to the structure associated with the conversion circuit 122.

Figure 6:
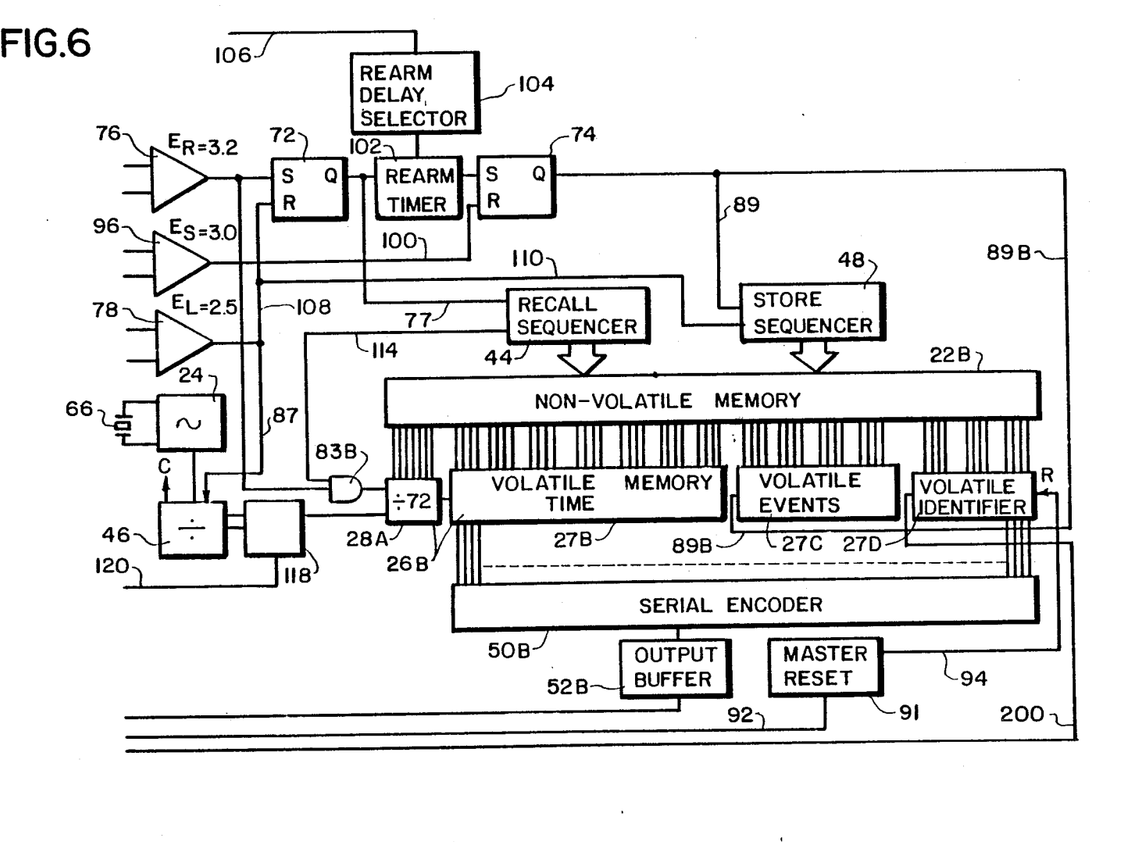
FIG. 6 is a schematic circuit diagram of a modification of the embodiment of FIG. 2 for measuring both operating time and a count of the number of operation events.

FIG. 6 illustrates another modified embodiment of the invention which measures cumulative operations in terms of total operating time and also in terms of a count of the number of times operation is initiated. FIG. 6 corresponds in great measure to the embodiment of FIG. 2, but some of the circuitry common to that in FIG. 2 has been omitted for clarity. This applies particularly to the parts of the circuit shown on the left side of FIG. 2.

The system of FIG. 6 includes an expanded nonvolatile memory 22B, and an expanded volatile memory 26B. The expanded volatile memory 26B includes the former decimal register 27, as indicated at 27B, which is dedicated to the recordation of elapsed time, plus a volatile event counter decimal register 27C plus a volatile identifier number register 27D. Since the system of FIG. 6 is not capable of conversion from one mode to another, the conversion circuit 122 of FIG. 2 is omitted. The operating time is measured in the volatile memory register 27B as previously described with respect to the embodiment of FIG. 2. Events are registered in the volatile events register 27C each time the rearm timer 102 times out, and latch 74 is set to sent a signal on connection 89B to the input of the volatile events register 27C. This operation is exactly analogous to the operation of the system of FIG. 2 in the two wire event counter mode as described above. While only four decimal places are indicated for the volatile events 24 register 27C, it will be understood that this memory may be expanded to provide for the storage of more than a four digit record of events.

The volatile identifier register 27D is capable of storing an identifier number for the operations measurement system, which may correspond to a number assigned to the load device to which the operations measurement system is assigned. The number stored in the volatile identifier memory register 27D may be determined by counting in the desired number of pulses on an input line 200 which feeds into the lowest order register of the volatile identifier memory 27B. After the volatile identifier register has once been set, it is not usually reset, unless the load device is assigned a new number, or unless the operations measurement system is connected to a new load device having a different number. If desired the identifier register 27D may be used for some purpose other than storage of an identifier number.

The nonvolatile memory 22B is provided with enough additional capacity to store all of the data added by the additional volatile memory registers 27C and 27D. Thus, each time the system is de-energized, the store sequencer 48 automatically transfers all of the data from all of the volatile memory registers into the nonvolatile memory 22B, and each time the system is energized, the recall sequencer 44 transfers the last previously stored data into the respective volatile memory registers.

The serial encoder 50B is similarly enlarged from the serial encoder 50 of the embodiments of FIG. 1 and FIG. 2. However, the serial encoder 50B and the output buffer 52B operate as previously described with respect to FIG. 5 to provide for a serial readout of all of the registers. The additional decimal register positions added by the volatile events register 27C and the volatile identifier register 27D simply double the length of the readout interval between the initial interval 190 in FIG. 5 and the beginning of the long logic zero interval 192 as shown in FIG. 5. The remainder of the operation of the serial encoder and the output buffer is identical to that described in connection with FIG. 5.

The embodiment of FIG. 6 combines the functions of an elapsed time measurement system and a two wire events counter. It will be obvious that a three wire events counter could be incorporated in this FIG. 6 embodiment instead of the two wire events counter.

In the introduction to this specification, it was pointed out that one of the limitations of the prior operations measurement systems using electromechanical components is that the response time of such prior system is limited. It will be apparent from the above description that the systems according to the present invention provide for response times which may be as short as desired, and which may provide cumulative operating time measurements which are extremely accurate. It should be emphasized that the systems according to the present invention are also capable of providing a selection of long operating response times, which may be even longer than those of which the electromechanical device systems are capable, in order to "filter out" erroneous signals which should not be counted or timed.

The response times and the precision of the systems of the present invention may be determined or adjusted by selecting or adjusting different values for the capacitor 20, different time-out intervals for the rearm timer 102 of FIG. 2 or FIG. 6, by selecting different base frequencies as determined by selection of the crystal 66, and by selection of different division factors for the divider counter register 28 (28A) of FIGS. 1, 2, and 6.

As previously mentioned above, the operations measurement systems of the present invention may be operated in response to incoming signals which are either alternating current or direct current signals. The systems is preferably designed to operate in response to any input signal voltage which is at least five volts or greater. When greater voltages are employed, an additional voltage dropping resistor is preferably used in series with the diode 62. Alternatively, voltage dropping resistors may be provided in the lines from both of the input terminals 10 and 12. With the simple addition of suitable voltage dropping resistors, the operations measurement systems of the present invention may be employed for any voltage of five volts or higher, and that voltage may be dc voltage or any ac voltage of 40 hertz or higher. Thus, this one operations measurment system is substantially universally applicable for the measurement of operations of virtually any device from which an electrical signal is available during operation. This is in substantial contrast to prior operations measurement systems which typically employed electrical relay windings which must be matched to the input voltage and frequency, and must be designed differently for alternating and direct current applications. The systems of the present invention are also operable with any input voltage wave shape, as long as the capacitor 20 is supplied with sufficient charging energy.

While this invention has been shown and described in connection with particular preferred embodiments, various alterations and modifications will occur to those skilled in the art. Accordingly, the following claims are intended to define the valid scope of this invention over the prior art, and to cover all changes and modifications falling within the true spirit and valid scope of this invention.

I claim:

1. A cumulative operations measurement system for connection to a source of supply voltage and operable in response to an operating voltage for accurately measuring a summation of the operations when that operating voltage is present, said system comprising a capacitor connected to be charged by the supply voltage, a volatile multiple-stage memory register connected to receive the operating voltage signals to be counted at the low order end thereof and operable to store said signals as a measure of total operations, a nonvolatile multiple-stage memory register having stages corresponding to at least some of the stages of said volatile memory register, means for detecting when the supply voltage is removed, a store sequencing means connected to be powered by the energy stored in said capacitor and connected to said last-named means and operable in response thereto to transfer the count stored in said volatile memory register into said nonvolatile memory register for storage therein, means for detecting when the supply voltage is applied. a recall sequencing means connected to said last-named means and operable in response thereto to transfer the count stored in said nonvolatile memory register into said volatile memory register.

2. A cumulative operations measurement system as claimed in claim 1 wherein the operating voltage is the supply voltage and the summation of the operations when the operating voltage is present is taken by measuring the elapsed time during which the operating voltage is present and wherein there is provided an oscillator, and wherein said volatile memory register is connected to receive electrical operations signals in the form of output pulses from said oscillator and wherein the storage of said signals is a measure of total operations time.

3. A system as claimed in claim 2 wherein a frequency divider is connected between said oscillator and said volatile memory register for dividing the frequency of said oscillator down to conventional unit of time.

4. A system as claimed in claim 1 wherein the summation of the operation when the operation voltage is present is taken by measuring the elapsed time during which the operating voltage is present and wherein the summation of operations is also taken by counting and summing the number of times that the operating voltage rises to an operating value, and wherein said volatile memory register and said nonvolatile memory register both include sections for the respective storage of a summation of the elapsed time during which the operating voltage is present and for storing a summation of the count of the number of times that the operating voltge rises to an operating value.

5. A system as claimed in claim 4 which is also operable for storing an identification number and wherein said volatile memory register includes still another section for the storage of the identification number, and wherein said nonvolatile memory also includes the capacity for storage of the identification number.

6. A system as claimed in claim 1 wherein at least one resistor is connected in series in the line from the supply voltage to said capacitor to form a filter element in association with said capacitor.

7. A system as claimed in claim 1 wherein there is provided a maximum voltage limiter device arranged for connection in shunt with said capacitor for limiting the maximum voltage applied across said capacitor and to the system beyond said capacitor.

8. A system as claimed in claim 1 wherein there is included a maximum impedance limit circuit connected in shunt with said capacitor to determine the maximum discharge impedance for said capacitor.

9. A system as claimed in claim 1 wherein said store sequencing means is operable to accomplish said transfer by comparing the binary value stored in each stage of said nonvolatile memory with the binary value stored in each corresponding stage of said volatile memory register and by initiating a write operation to change the state of only those stages in the nonvolatile memory which must be changed to coincide with the state of the corresponding stages in said volatile memory register.

10. A system as claimed in claim 1 which includes at least two voltage threshold circuits which are operable for receiving and comparing a voltage representative of the operating voltage with a different fixed threshold voltage value for each threshold circuit, one of said voltage threshold circuits having a higher fixed threshold voltage value than the other, and wherein aid means for detecting when the operating voltage is applied comprises a first voltage sequence detection circuit connected to said voltage threshold circuits and operable to detect the sequence wherein the lower voltage threshold is passed and then the upper voltage threshold is passed by the operating voltage, and wherein said means for detecting when the operating voltage is removed comprises a second voltage sequence detection circuit connected to said threshold voltage circuits and operable to detect when the operating voltage is removed by detecting a sequence in which the higher voltage threshold is passed and then the lower voltage threshold is passed by the operating voltage.

11. A system as claimed in claim 10 wherein separate lower threshold voltage circuits are provided respectively for said first voltage sequence detection circuit and said second voltage sequence detection circuit, the lower voltage threshold for said second voltage sequence detector for detecting when the operating voltage is removed being higher than the lower voltage threshold for said first voltage sequence detector for detecting when the operating voltage is applied.

12. A system as claimed in claim 11 wherein a circuit means is provided which is connected between the output of one of said lower threshold voltage circuits and an input of said store sequencing means to disable said store sequencing means at all voltage levels below the threshold of said last-named lower threshold circuit.

13. A system as claimed in claim 10 wherein a circuit means is connected between an output of said first voltage sequence detector and the upper threshold voltage level input of said second voltage sequence detector for signifying to said second voltage sequence detector that the operating voltage has achieved a level above said upper threshold voltage level, said circuit means being operable to provide a signal to said second voltage sequence detector for the upper threshold voltage only after there is an output from said first voltage sequence detector recognizing that the operating voltage has been applied so that said second voltage sequence detector is operable to detect the declining sequence of voltages to actuate said store sequencing means only after said first voltage sequence detector has been operable to actuate said recall sequencing means.

14. A system as claimed in claim 13 wherein said circuit means connected between the output of said first voltage sequence detector and the upper threshold voltage input of said second voltage sequence detector comprises a rearm timer which is operable to delay the delivery of a signal from the output of said first voltage sequence detector so that said second voltage sequence detector is only operable to detect a decreasing voltage sequence after the time delay provided by said rearm timer, said first voltage sequence detector being operable to detect a declining voltage sequence and to withdraw the output signal to said rearm timer in response to the declining voltage sequence, said rearm timer being automatically resettable upon withdrawal of the output signal from said first voltage sequence detector before the rearm timer has timed out.

15. A system as claimed in claim 14 wherein said rearm timer includes means for selectively changing the time delay interval.

16. A system as claimed in claim 14 wherein a circuit means is connected between the output of said upper threshold voltage circuit and an enabling input to said volatile memory register, said circuit means being operable for enabling said volatile memory register to receive and count operations signals only while the operating voltage is above the threshold voltage of said upper threshold voltage circuit.

17. A system as claimed in claim 16 wherein said last-named circuit means is operable for enabling said volatile memory register to receive and count operations signals only after a time delay interval which assures that the recall sequencing means has completed the recall sequence of recalling the data stored in said nonvolatile memory into said volatile memory register.

18. A system as claimed in claim 17 wherein said last-named circuit means includes a time delay means and an AND gate, said AND gate being operable only in response to a coincidence of a signal indicating that the operating voltage is above the threshold level and a time delayed signal available after a time delay interval after the operating voltage is above the threshold voltage of said upper threshold voltage circuit.

19. A system as claimed in claim 18 wherein said time delay means comprises a connection from said recall sequencing means for sending a signal to said AND gate indicating that the recall sequence has been completed, said AND gate being operable only after the completion of a recall sequence and the coincidence of an output from said upper threshold voltage circuit to enable said volatile memory register to receive and count operations signals.

20. A system as claimed in claim 1 wherein there is provided a diode connected in series in the connections to the source of operating voltage to accommodate the system to alternating operating voltage, and to isolate the system from the impedance of the source of operating voltage.

21. A system as claimed in claim 1 including a serial encoder connected to receive parallel readout data from said volatile memory register and operable to provide a chain of binary bits corresponding to the contents of said volatile memory register in serial form, an output buffer memory connected to receive the serial chain of binary bits from said serial encoder, and an output connection from said output buffer for sending the serial output signals to a reader device.

22. A system as claimed in claim 21 including a separable reader device operable for receiving and interpreting the chain of binary signals from said output buffer, said serial encoder and said output buffer being operable for generating marker signals to indicate the beginning of a chain of data signals, and said reader device including means for recognizing said marker signals and for interpreting the chain of digital signals based upon timing established by said marker signals.

23. A system as claimed in claim 1 wherein the summation of the operations when the operating voltage is present is taken by counting and summing the number of times that the operating voltage rises to an operating value and wherein each of said electrical operations signals actuates said volatile memory register for incrementation by a single count.

24. A system as claimed in claim 23 wherein the operating voltage for which operations are to be measured is the supply voltage.

25. A system as claimed in claim 23 wherein a signal channel is provided for the operating voltage which includes a digital low-pass filter.

26. A system as claimed in claim 1 which includes an oscillator, and which also includes a conversion circuit selectively operable in response to conversion control signals to optionally select a first mode of operation for the system wherein the measurement of the summation of the operations when the operation voltage is present is obtained by measuring the total elapsed time during which said operating voltage is present and summing those elapsed times, and to optionally select a select mode of operation for the system wherein the measurement of the summation of the operations when the operating voltage is present is obtained by measuring each occurrence of the presence of the operating voltage and counting and summing the counts of those occurrences of the operating voltage.

* * * * *

UNITED STATES PATENT AND TRADEMARK OFFICE
CERTIFICATE OF CORRECTION

PATENT NO. : 4,712,195

DATED : Dec. 8, 1987

INVENTOR(S) : Eugene P. Finger

It is certified that error appears in the above-identified patent and that said Letters Patent is hereby corrected as shown below:

| | | |
|---|---|---|
| Column 1, | line 12, | "to the" should read --to that--; |
| | line 33, | "counter" should read --counters--. |
| Column 2, | line 6, | "an" should read --and--; |
| | line 47, | "even" should read --event--; |
| | line 49, | "na" should read --an--; |
| | line 53, | "an" should read --and--. |
| Column 3, | lines 9-10, | "a voltage" should read --a volatile--. |
| Column 4, | line 5, | "systems" should read --system--; |
| | line 7, | "include" should read --including--; |
| | line 54, | "for" should read --from--. |
| Column 6, | line 16, | "amplifier (the threshold is cross) should read --amplifier, (the threshold is crossed)--. |
| Column 9, | line 25 | "consisten" should read --consistent--. |
| Column 11, | line 43 | "injhibits" should read --inhibits--; |
| | line 55, | "FIG. 1" should read --FIG. 2--. |
| Column 12, | line 47, | "logner" should read --longer--. |
| Column 15, | line 4, | "operation" should read --operations--; |
| | line 48, | "reset" should read --resets--. |
| Column 16, | line 14, | "in" should read --is--. |
| Column 19, | line 4, | "by" should read --be--. |
| Column 22, | line 31, | "aid" should read --said--. |

Signed and Sealed this

Seventeenth Day of May, 1988

Attest:

DONALD J. QUIGG

*Attesting Officer*  Commissioner of Patents and Trademarks